(12) United States Patent
Salamone

(10) Patent No.: US 9,750,139 B2
(45) Date of Patent: Aug. 29, 2017

(54) MINIATURE SMT HOUSING FOR ELECTRONICS PACKAGE

(71) Applicant: CIRCOR AEROSPACE, INC., Hauppauge, NY (US)

(72) Inventor: Brent Salamone, Dix Hills, NY (US)

(73) Assignee: Circor Aerospace, Inc., Hauppauge, NY (US)

(*) Notice: Subject to any disclaimer, the term of this patent is extended or adjusted under 35 U.S.C. 154(b) by 0 days.

(21) Appl. No.: 15/172,744

(22) Filed: Jun. 3, 2016

(65) Prior Publication Data

US 2016/0374214 A1 Dec. 22, 2016

Related U.S. Application Data

(60) Provisional application No. 62/181,789, filed on Jun. 19, 2015, provisional application No. 62/187,928, filed on Jul. 2, 2015.

(51) Int. Cl.
*H05K 1/18* (2006.01)

(52) U.S. Cl.
CPC .................................. *H05K 1/181* (2013.01)

(58) Field of Classification Search
None
See application file for complete search history.

(56) References Cited

U.S. PATENT DOCUMENTS

| | | | | |
|---|---|---|---|---|
| 3,541,230 A | * | 11/1970 | Kramer | H05K 3/301 174/138 G |
| 4,959,761 A | * | 9/1990 | Critelli | F21V 19/002 257/99 |
| 4,975,671 A | * | 12/1990 | Dirks | H01F 17/0033 336/200 |
| 5,019,944 A | * | 5/1991 | Ishii | H01R 4/04 174/259 |
| 5,029,335 A | * | 7/1991 | Fisher | F25B 21/02 165/80.3 |
| 5,264,998 A | * | 11/1993 | Bax | H01R 33/09 362/646 |
| 5,975,939 A | * | 11/1999 | Market | H01R 4/22 174/87 |
| 6,166,894 A | * | 12/2000 | Kane | H04M 3/18 361/119 |
| 6,432,745 B1 | | 8/2002 | Waitl et al. | |
| 6,716,673 B2 | | 4/2004 | Waitl et al. | |
| 7,005,311 B2 | | 2/2006 | Waitl et al. | |
| 7,102,212 B2 | | 9/2006 | Waitl et al. | |
| 7,245,794 B2 | | 7/2007 | Ishizaka | |
| 7,288,831 B2 | | 10/2007 | Waitl et al. | |
| 7,387,252 B2 | * | 6/2008 | Gannon | G06K 7/10732 235/454 |

(Continued)

*Primary Examiner* — Dimary Lopez Cruz
*Assistant Examiner* — Muhammed Azam
(74) *Attorney, Agent, or Firm* — McNees Wallace & Nurick LLC

(57) ABSTRACT

A housing, for surface-mount technology (SMT), accepts any electronics package that is mounted on a circular substrate. The housing including the assembled electronics package forms an SMT housing assembly. The SMT housing assembly is placed directly onto the surface of a printed circuit board (PCB). The SMT housing assembly is soldered to the PCB using standard soldering techniques, establishing an electrical connection between the electronics package and the PCB.

9 Claims, 4 Drawing Sheets

(56) References Cited

U.S. PATENT DOCUMENTS

| | | | | |
|---|---|---|---|---|
| 8,063,317 B2* | 11/2011 | Bowman | H02G 3/185 | 174/480 |
| 8,545,236 B2* | 10/2013 | Roberts | H01R 12/716 | 439/68 |
| 9,010,977 B2* | 4/2015 | Harbers | F21K 9/00 | 362/294 |
| 9,017,112 B1* | 4/2015 | Knowles | H01R 4/22 | 439/750 |
| 2002/0139574 A1* | 10/2002 | Hosaka | H01R 13/03 | 174/256 |
| 2002/0153153 A1* | 10/2002 | Jakob | H05K 3/301 | 174/541 |
| 2003/0034394 A1* | 2/2003 | Gannon | G06K 7/10732 | 235/454 |
| 2003/0089776 A1* | 5/2003 | Hennick | G06K 7/10732 | 235/454 |
| 2004/0177988 A1* | 9/2004 | Kiely | H02G 3/0691 | 174/656 |
| 2005/0211455 A1* | 9/2005 | Cole | H02G 3/185 | 174/485 |
| 2006/0169472 A1* | 8/2006 | Waters | H02G 3/08 | 174/60 |
| 2006/0252313 A1* | 11/2006 | Ice | G02B 6/3897 | 439/736 |
| 2007/0047952 A1* | 3/2007 | Kim | G03B 17/02 | 396/542 |
| 2007/0125576 A1* | 6/2007 | Karmazyn | B29C 45/0046 | 174/541 |
| 2010/0133553 A1* | 6/2010 | Meyer, IV | F21K 9/00 | 257/88 |
| 2012/0312575 A1* | 12/2012 | Chou | B29C 45/14221 | 174/50 |
| 2012/0312577 A1* | 12/2012 | Carbone | H02G 3/088 | 174/66 |
| 2013/0044501 A1* | 2/2013 | Rudisill | F21V 29/70 | 362/398 |
| 2015/0349506 A1* | 12/2015 | Permesang | E04F 19/08 | 174/541 |
| 2015/0357806 A1* | 12/2015 | Korcz | H02G 3/083 | 174/541 |
| 2016/0270238 A1* | 9/2016 | Dalke | H05K 3/32 | |
| 2016/0359426 A1* | 12/2016 | Jitaru | H05K 1/0256 | |
| 2016/0374214 A1* | 12/2016 | Salamone | H05K 1/181 | |

\* cited by examiner

MINIATURE SMT HOUSING FOR ELECTRONICS PACKAGE

FIELD OF THE INVENTION

The present invention is directed to the field of packaging technology for electronics assembled to circuit boards, and in particular for a housing that electrically insulates and isolates an electronic package while simplifying assembly to a PCB.

BACKGROUND OF THE INVENTION

A packaging process for electronic packages is one important step in forming electronic products. The housing for the electronics package not only provides protection for the electronics from environmental contaminants, but also provides a connection interface for the electronics package therein. The housing also protects the electronics package from stray electrical discharges which could be damaged, rendering them unusable.

The housing desirably should include mounting capabilities for mounting the electronics package mechanically within it, while still providing the ability to form a sound electrical connection with the electronics package. Ideally, the housing should provide the ability to inspect the integrity of the electrical connection.

Because of the increased use of robotics in handling the electronics packages, the housing should allow or improve the ability of robotics to handle the housing for assembly of the electronics package to the housing, for both the assembly of the electronics package to the housing and the assembly of the housing assembly to a printed circuit board. The housing assembly should also handle the elevated temperatures required to electrically connect the housing assembly to the printed circuit board.

Because the sizes of electronic products continue to shrink, it has become an important issue to properly mount electronics packages within a housing of smaller volume while the housing provides additional functionalities.

SUMMARY OF THE INVENTION

The present invention provides a housing for surface-mount technology (SMT). In particular, the housing accepts any electronics package that is mounted on a circular substrate. The housing including the assembled electronics package forms a SMT housing assembly. The SMT housing assembly is placed directly onto the surface of a printed circuit board (PCB). The SMT housing assembly is soldered to the PCB using standard soldering techniques, establishing an electrical connection between the electronics package and the PCB.

The housing accepts any miniature electronics package mounted on a circular substrate. The housing is molded to a size that corresponds to the diameter of the circular substrate on which the miniature electronics package is mounted. Thus, the housing may be of a predetermined size corresponding to the size of the circular substrate on which the electronics package is mounted. The SMT housing of the circular substrate includes a cylindrical cavity of predetermined diameter that accepts the circular substrate.

The miniature SMT housing of the present invention further includes a plurality of lead cavities. Each of the plurality of lead cavities may accept leads from the miniature electronics package after the electronics package is assembled into the cylindrical cavity of the SMT housing. The miniature electronics package includes at least one lead, and leads from the miniature electronics package are positioned within the lead cavities by any convenient means. The lead cavities are separated from one another so that assembled leads may be electrically isolated from one another.

Once the electronics package is assembled to the miniature SMT housing, the combination forms an SMT housing assembly. The assembly of the leads from the miniature electronics package into the lead cavities mechanically secures the electronics package to the miniature SMT housing, allowing it to be handled. The miniature SMT housing includes a flat surface allowing the SMT housing to be used with standard flat nozzles on well-known pick and place machines, allowing the pick and place machines to lift the SMT housing assembly and accurately place it on a PCB.

One embodiment of the present invention is directed to a non-conductive miniature SMT housing, including a non-conductive shell having a first end and a second end. The SMT housing further includes a cylindrical cavity having a preselected diameter located within the shell. The SMT housing further includes an annular counterbore having a preselected diameter, the preselected diameter of the annular counterbore being larger than the preselected diameter of the cylindrical cavity, the annular counterbore located at the first end of the shell extending a preselected axial length and forming a shoulder at the first end. The SMT housing further includes a flat region extending tangentially along the shell, and a plurality of feet, the feet positioned opposite the flat region, each of the feet extending parallel to a central axis of the shell, each of the feet including a semi-circular cavity of predetermined radius.

Another embodiment of the present invention is directed to a non-conductive miniature SMT housing assembly, including a non-conductive shell having a first end and a second end. The SMT housing further includes a cylindrical cavity having a preselected diameter located within the shell. The SMT housing further includes an annular counterbore having a preselected diameter, the preselected diameter of the annular counterbore being larger than the preselected diameter of the cylindrical cavity, the annular counterbore located at the first end of the shell extending a preselected axial length and forming a shoulder at the first end. The SMT housing further includes a flat region extending tangentially along the shell and a plurality of feet, the feet positioned opposite the flat region, each of the feet extending parallel to a central axis of the shell, each of the feet including a semi-circular cavity of predetermined radius. The SMT housing further includes an electronics component having a plurality of axial leads, the component having a flange of circular cross section and a body. The flange has a diameter no greater than the preselected diameter of the annular counterbore of the housing and the body has a diameter no greater than the preselected diameter of the cylindrical cavity of the housing, and each of the plurality of axial leads from the electronics component are arcuately bent into one of the plurality of feet.

The SMT housing is comprised of a material that is electrically insulative to protect the miniature electronics package from any stray electrical charges that may be present. In addition, the SMT housing has temperature capabilities that enable it to withstand the temperatures of soldering without any degradation of properties, while maintaining its shape.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present invention provides a housing for use with an electronics package such as are used for surface mount technology (SMT). The housing and the electronics package are assembled together to form an SMT housing assembly, the electronics package being mechanically secured to the housing. The SMT housing assembly is then assembled to a printed circuit board (PCB) and the SMT housing assembly is then soldered to the PCB, the soldering operation accomplishing the electrical connection of the SMT housing to the PCB and metallurgically securing the SMT housing assembly to the PCB. The soldering operation is accomplished in the usual manner for securing SMT assemblies to PCBs, by wave or reflow soldering, although other soldering methods may be used to secure the SMT housing assembly to the PCB.

Figure 1:
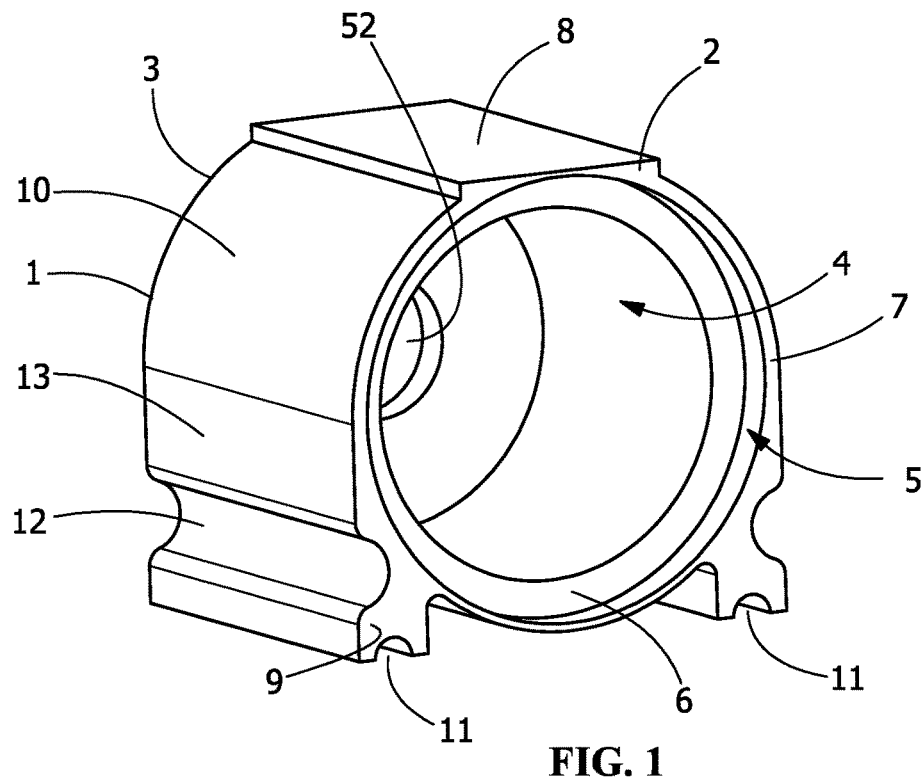
FIG. 1 is a front perspective view of an SMT housing.

The miniature SMT housing 1 of the present invention is depicted in FIG. 1. Housing 1 has a first end 2 and a second end 3. A generally circular shell 10 extends between first end 2 and second end 3. A cylindrical cavity 4 is formed within circular shell 10 and between first end 2 and second end 3. Second end 3 includes a small aperture 52 in fluid communication with cylindrical cavity 4. An annular counterbore 5 is formed in cylindrical cavity 4 adjacent to first end 2. Annular counterbore 5 has a preselected diameter that is larger than the diameter of cylindrical cavity 4.

Counterbore 5 extends axially from first end 2 toward second end 3 for a predetermined axial length forming a shoulder 6. As will be become evident, the predetermined axial length of shoulder 6 is a function of the electronics package assembled inside of or within housing 1. A circumferential region 7 formed by counterbore 5 extending axially along shoulder 6 provides electrical insulation along counterbore 5 of housing 1.

Figure 4:
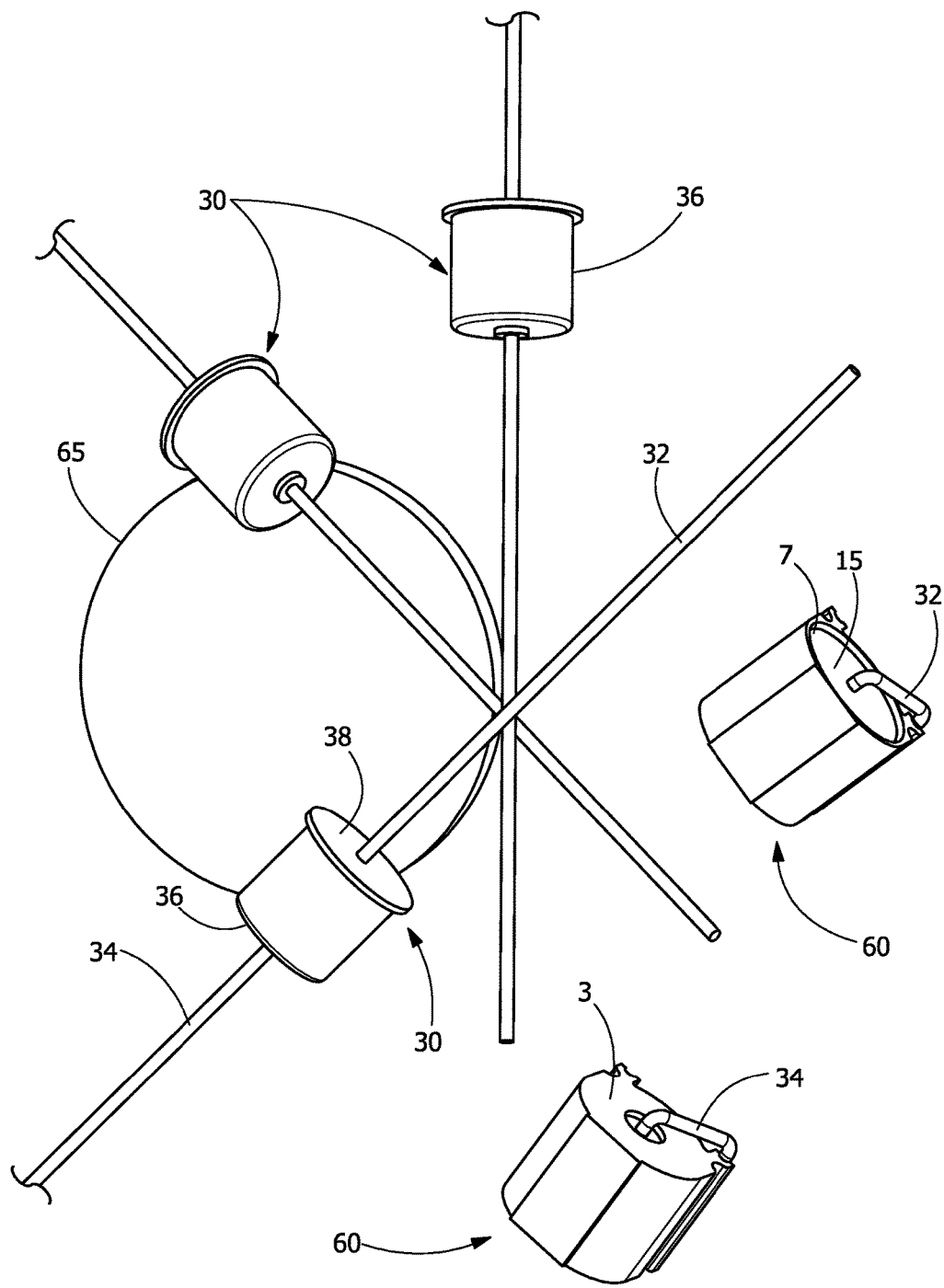
FIG. 4 provides a view of a preferred electronics package prior to insertion into a miniature SMT housing of the present invention and after assembly into a miniature SMT housing to form a miniature SMT housing assembly.

Also evident in FIG. 1 is a flat region 8 extending tangentially along shell 10. Opposite flat region 8 on housing 1 is a plurality of feet 9. Each of the plurality of feet 9 extend from circular shell 10 parallel to a central axis of shell 10. Plurality of feet 9 extend at least partially along shell 10 and preferably have lengths that are the same as the length of the shell. In a preferred embodiment, as shown in FIG. 1, there are two feet 9, although additional feet 9 can be formed in housing 1 and can be positioned between feet 9 shown in FIG. 1, when additional feet are required by the design. As can be seen from FIG. 1, each of the plurality of feet 9 includes a cavity 11, such as a semi-circular cavity, the radius of the cavity being predetermined by the radius of leads extending from the electronics package. Immediately above the plurality of feet on either side of shell 10 is an optional second cavity 12. Each second lead cavity 12 can also include a semi-circular cavity having a predetermined radius. In one embodiment, cavities 12 are oriented onto shell 10 and positioned substantially at right angles to lead cavities 11. Cavity 12 allows for the placement or capturing of a third or fourth lead (from a switch, such as a kinetic switch (kinetic switch 30 as shown in FIG. 4 only shows two leads 32, 34)) that is not to be soldered to the PCB, but rather may be soldered to some other external wire or contact in the next assembly (i.e., ground). Cavity 12 also provides a benefit for some high-volume plastic injection molds by reducing the relatively large plastic region (i.e., "thick area") in the mold, which can prevent excessive shrinkage/warping in that region. The exterior of shell may optionally include a flat index region 13 positioned between top flat surface 8 and a plurality of feet 9 on either side of shell. In one embodiment, cavities 11, 12 can be non-circular.

Figure 6:
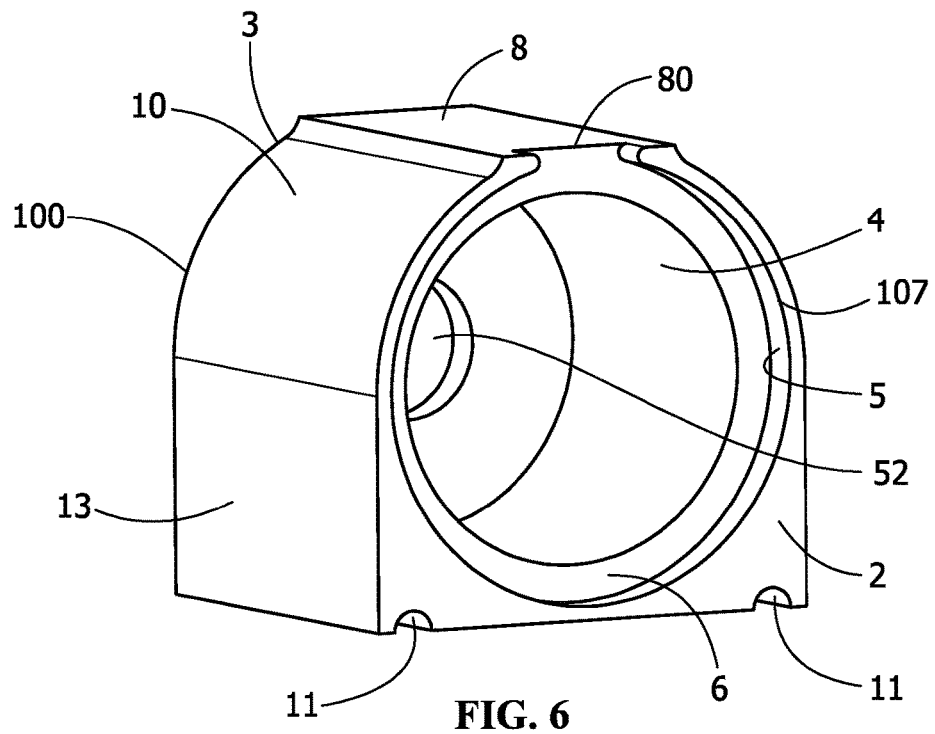
FIG. 6 is a front perspective view of an SMT housing.

In one embodiment, as shown in FIG. 6, miniature SMT housing 100, which is generally similar to miniature SMT housing 1, has a profile when viewed directly facing first end 2, resembling a blunt-nosed bullet. That is, SMT housing 100 lacks a second lead cavity 12 (see FIG. 1 of SMT housing 1), SMT housing 100 instead having an extended flat index region 13 in place of the second lead cavity. In addition, region 107 differs from circumferential region 7 of SMT housing 1 (FIG. 1) in that the upper portion of region 107 terminates at top flat surface 8, the resulting termination being identified as a termination region 80 or discontinuity. It is to be understood that embodiments of the SMT housing can include other profile variations, including any combination or variation of features, so long as such features do not interfere with the function of the SMT housing as discussed herein.

Figure 7:
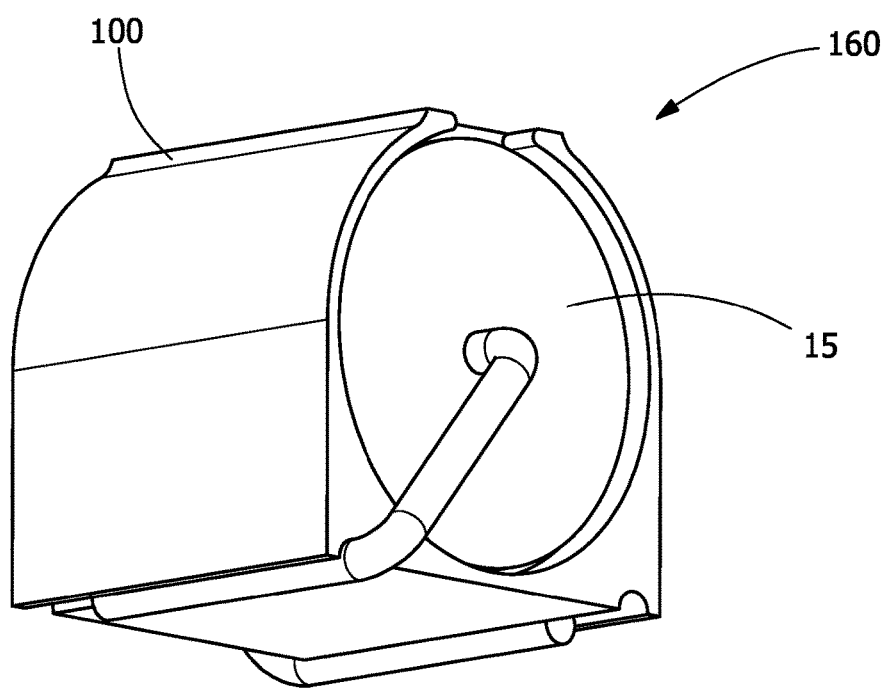
FIG. 7 is a front perspective view of an SMT housing assembly.

FIG. 7 shows SMT housing assembly 160, comprising SMT housing 100 into which an electronics package 15 is assembled as previously discussed. For purposes herein, the term "circumferential region" or the like is intended to include region 107, which includes a discontinuity.

Miniature SMT housing 1 may be comprised of any material that is insulative and that can withstand the heat resulting from reflow or wave soldering. The reflow or wave soldering process is a common method used to attach surface mount components such as the miniature SMT housing assembly of the present invention to a PCB which is normally performed in the temperature range of 460-482° F. for very short periods of time. As will be evident, miniature SMT housing itself is adjacent to the reflow or wave soldering region and is subjected to these temperatures for a brief time. The miniature SMT housing should not melt during this brief exposure to the elevated soldering temperatures. Another requirement of the material used for fabrication of miniature SMT housing 1 is that it is injection moldable, allowing for the formation of the housings rapidly and at relatively low costs. The material has a temperature of use of at least about 375° F. and preferably in the range of about 375-420° F. Preferred materials having the prerequisite properties include non-conductive polymeric materials, which may be either thermoplastic or thermoset polymers.

One such preferred material is a thermoplastic injection moldable polyphenylsulfone having a resistivity of about 9.0 E+15 ohm·cm and a dielectric constant of about 3.40-3.44 in the range of 60 Hz-1 kHz. One preferred polyphenylsulfone is Radel®R-5100 available from Solvay Specialty Polymers, 4500 McGinnis Ferry Road, Alpharetta, Ga. 30005. Another preferred material is a thermoplastic injection moldable polyphenylene sulfide having a resistivity of about 1.0 E+16 ohm·cm and a dielectric constant of about 3.8 in the range of 1 kHz-1 MHz. One preferred material is a fiberglass reinforced polyphenylene sulfide, Ryton®R-4 02, available from Chevron Phillips Chemical Company LLC, 10001 Six Pines Drive, The Woodlands, Tex. 77830.

Figure 2:
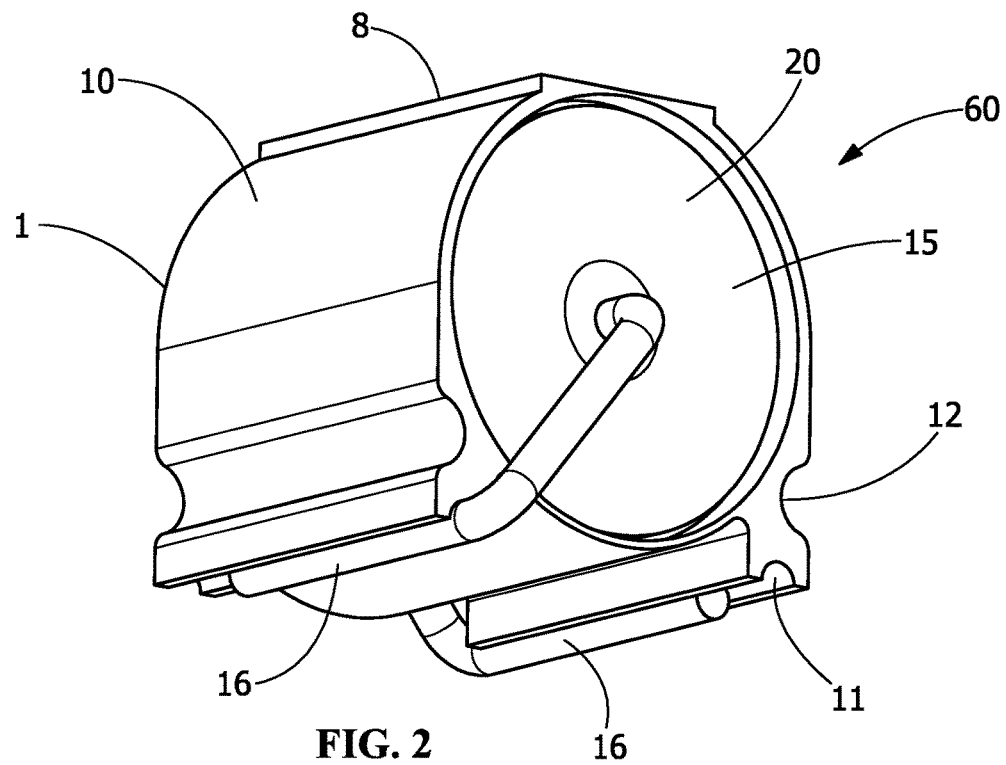
FIG. 2 is a front perspective view of an SMT housing assembly.

Referring now to FIG. 2, which is a front perspective view of an SMT housing assembly 60 of the present invention, an electronics component 15 is depicted assembled into miniature SMT housing 1. As used herein, an electronics component includes any electronics package that is connected to PCB by soldering, such as, but not limited to, a switch assembly such as a kinetic switch, a transistor assembly package, such as a TO-18 or TO-94 assembly package or a circuit mounted on a small board installable into miniature SMT housing 1 for assembly onto a PCB. Typical electronics components that may be assembled into a SMT housing 1 are depicted in FIG. 4 include, in a preferred embodiment, kinetic switches 30. Each kinetic switch includes a pair of leads, a first lead 32 and a second lead 34 extending from a cylindrical body 36. A flange 38 having a circular cross section extends away from one end of cylindrical body 36. Cylindrical body 36 and flange 38 of kinetic switch 30 are metallic. A kinetic switch 30 is also shown assembled into a miniature SMT housing 1, forming a SMT housing assembly 60. As can be seen in FIGS. 2 and 4, the leads 32 and 34 of kinetic switch 30 are bent into lead cavities 11 of SMT housing 1. As further shown in FIG. 4, an exemplary coin 65 having a diameter of 0.84 inch and a thickness of 0.08 inch piece is included to show relative sizes of components, although it is to be understood in other embodiments, that the components may be further reduced in size, depending upon design applications and requirements.

Referring again to FIG. 2, electronics component 15 is shown assembled into miniature SMT housing 1. Electronics component 15 includes a pair of leads 16 and includes a flange having a circular cross section 20.

Flange 20 has a diameter that is the same as (providing an interference fit) or slightly smaller than annular counterbore 5 in SMT housing 1. Not visible in FIG. 2 is the body of electronics component 15 that extends into cylindrical cavity 4 of miniature SMT housing 1. A pair of leads 16, one visible and extending from first end 2 of SMT housing 1 are bent for insertion in respective lead cavities 11 of plurality of feet 9 of miniature SMT housing 1, the leads having an arcuate shape when bent for insertion in respective lead cavities 11 of the feet. The assembly of leads 16 in lead cavities 11 of feet 9 mechanically secures electronics component 15 to miniature SMT housing 1. A close review of FIG. 2 further discloses that the relationship between the diameter of leads 16 and the radius of lead cavities 11 is such that leads 16, once assembled into lead cavities 11, extend below SMT housing assembly 60. The result is that the radius (r) of a lead 16 is equal to or less than the radius of lead cavities 11, and that twice the radius (2*r) of a lead 16 is greater than the radius of lead cavities 11, so that leads 16, once assembled into lead cavities 11 always extends below SMT housing assembly 60.

Figure 3:
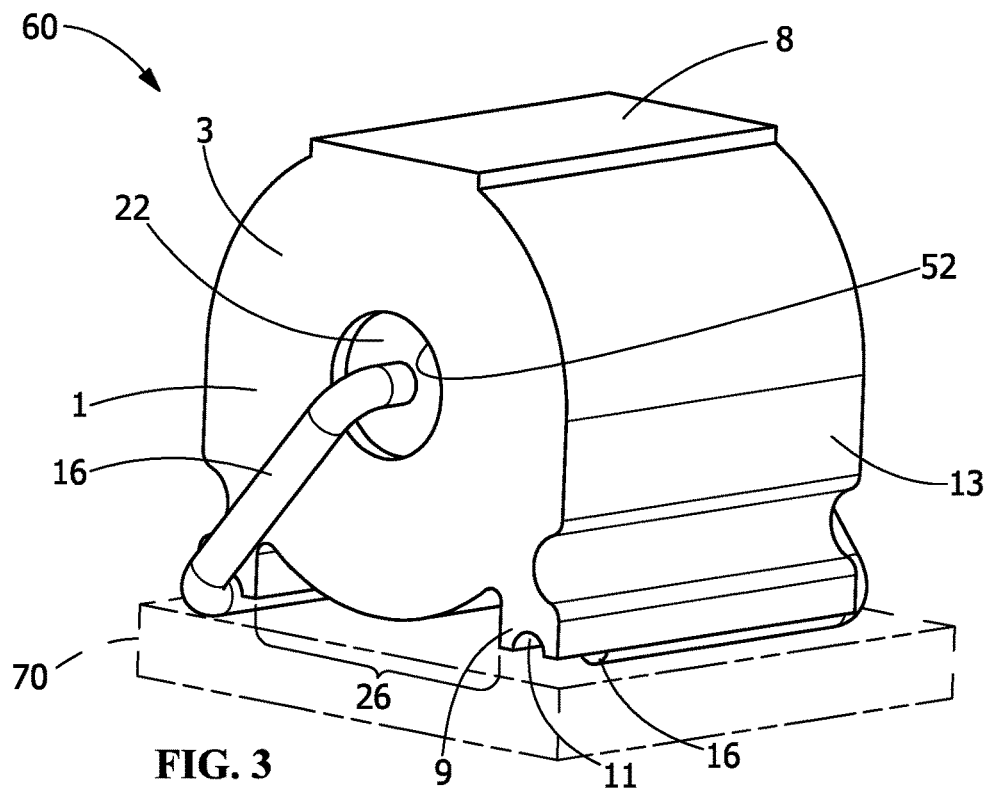
FIG. 3 is a rear perspective view of an SMT housing assembly.

FIG. 3 is a rear perspective view of the SMT housing assembly 60 of FIG. 2 to be secured to PCB 70. Lead 16 extends from second end 3 of SMT housing 1. Lead 16 attached to body 22 of electronics component 15 extends through small aperture 52 in housing 1 and has been bent for insertion into lead cavity 11. Body 22 of electronics component occupies cylindrical cavity of miniature SMT cavity 4 and body 22 may be cylindrical or may be cylindrical with a taper, the taper added to facilitate fit-up in cavity 4. Thus, the diameter of small aperture 52 is at least slightly larger than the diameter of lead 16 so that lead 16 from body 22 of electronics component 15 can be readily fed through small aperture 16. Also visible in FIG. 3, lead 16 from first end 2 of miniature SMT housing 1 (not visible in FIG. 3), has been bent and assembled into lead cavity 11. As discussed above, lead 16 is dimensioned such that lead 16 extends below lead cavity 12 and thus extends below miniature SMT housing 1. Body 22 of component 16 is visible through small aperture 52 in FIG. 3. In addition, since plurality of feet 9 extend below shell 10 of miniature SMT housing 1 and since the plurality of leads 16 extend below plurality of feet 9 as discussed above, an optional opening 26 exists between plurality of feet 9 and under shell 10 providing a line of sight.

The miniature SMT housing 1 of the present invention finds particular use in assembling an electronics component 15 to it in order to form a miniature SMT housing assembly 60 and in installing miniature SMT housing assembly 60 to a PCB. The assembly of electronics component 15 to a housing is an automated process accomplished by tape and reel machines, which are well known in the art. Tape and reel machines automatically load electronics components into housings and inspect to verify that all pockets or cavities are loaded. One typical machine is the AT 35, available from APT Automation of New Berlin, Wisc. 53151, although many other machines are available. Machines may be modified to automatically bend leads 16 into lead cavities 11, 12. Flat index regions 13 may be useful in handling and locating electronics component 15 with respect to the miniature SMT housing 1 while leads 16 are bent into lead cavities to form miniature SMT housing assemblies 60. Because miniature SMT housing 1 has flat spots, namely top flat surface 8, feet 9 and flat index regions 13, the amount of roll of miniature SMT housing 1 during assembly of electronics component 15 into housing 1 and the amount of roll of miniature SMT housing assembly 60 after completion of the assembly is minimal.

Next, miniature SMT housing assembly 60 is assembled to a PCB. Top flat surface 8 allows the use of pick and place machines with standard flat nozzles instead of the conventional metal electrode leadless face (MELF) devices used to pick up cylindrical packages. Pick and place machines also are well-known in the art and lift or pick the miniature SMT housing assembly 60 and accurately place them on a PCB. However, pick and place machines that use MELF devices suffer from "roll away," which is a tendency of cylindrical components to roll out of position during attempted placement if the pressure is not correct or if there is a pressure fluctuation. However, SMT housing assembly 60 permits the use of top flat surface 8 in conjunction with flat nozzles to pick and place miniature SMT housing assembly 60 onto a PCB. A vacuum drawn by a pick and place machine through the flat nozzles allows miniature SMT housing assembly 60 to be lifted at top flat surface 8 and accurately positioned on a PCB.

Once miniature SMT housing assembly 60 has been accurately assembled into position on a PCB, typically being held in place by solder tape, the miniature SMT housing assembly 60 may be soldered to the PCB, electrically connection miniature SMT housing assembly 60 to PCB and metallurgically attaching miniature SMT housing assembly 60 to PCB. Soldering is done by reflow soldering or wave soldering, in which a thin layer of molten solder is directed across the PCB. Although the molten solder has temperature in the range of 460-482° F., miniature SMT housing 1 is not damaged by this molten solder even though the maximum use temperatures for the miniature SMT housing materials is slightly lower than this, in the range of about 420° F. First, the molten solder flows over PCB for a very short period of time, so that the available time for exposure is very short. Additionally, miniature SMT housing 1 never directly contacts the molten solder. As previously discussed, the axial leads 16 are bent over into lead cavities 11 and are dimensioned so that axial leads 16 extend below lead cavities 11 so that axial leads 16 once assembled into cavities 11 extend below miniature SMT housing assembly 60. The flow of molten solder is sufficiently low that molten solder only directly contacts axial leads 16. Molten solder contacts the SMT housing assembly, if at all, as a result of capillary action as molten solder flows into any gap between axial leads 16 and lead cavities 11 and solidifies immediately. Although the reflow temperature is above the temperature use of the material used for housing 1, the solidification temperature of solder is about 428° F., marginally above the use temperature of the material used for housing 1 and only for a short time. Thus, soldering using reflow or wave soldering techniques can be accomplished with minimal or no effect on housing 1.

Additionally, because optional opening 26 exists underneath shell 10 providing a line of sight between shell 10 and a supporting surface of PCB 70 (FIG. 3), the integrity of the solder joint effected by reflow or wave soldering can be visually inspected. This permits visual inspection of the solder joint on both sides of leads 16.

The miniature SMT housing 1 of the present invention thus provides protection of an electronics component 15 assembled into it. The protection includes protection from stray electrical charges that can readily damage the component. In addition, miniature SMT housing 1 protects the electronics component assembled within it from mechanical damage and from dirt, dust and other contamination which may adversely affect its operation. The miniature SMT housing 1 of the present invention also facilitates automated assembly of an electrical package into it and provides mechanical coupling of electronics component 15 to miniature SMT housing 1 until soldering is accomplished. Miniature SMT housing 1 of the present invention also improves the ability of automated machinery to "pick and place" miniature SMT housing assembly 60 onto a PCB. Furthermore, the design of SMT housing assembly 60 as a result of the design of miniature SMT housing 1 permits wave or reflow soldering of SMT housing assembly 60 to a PCB without damage to miniature SMT housing assembly 60 or miniature SMT housing 1.

Figure 5:
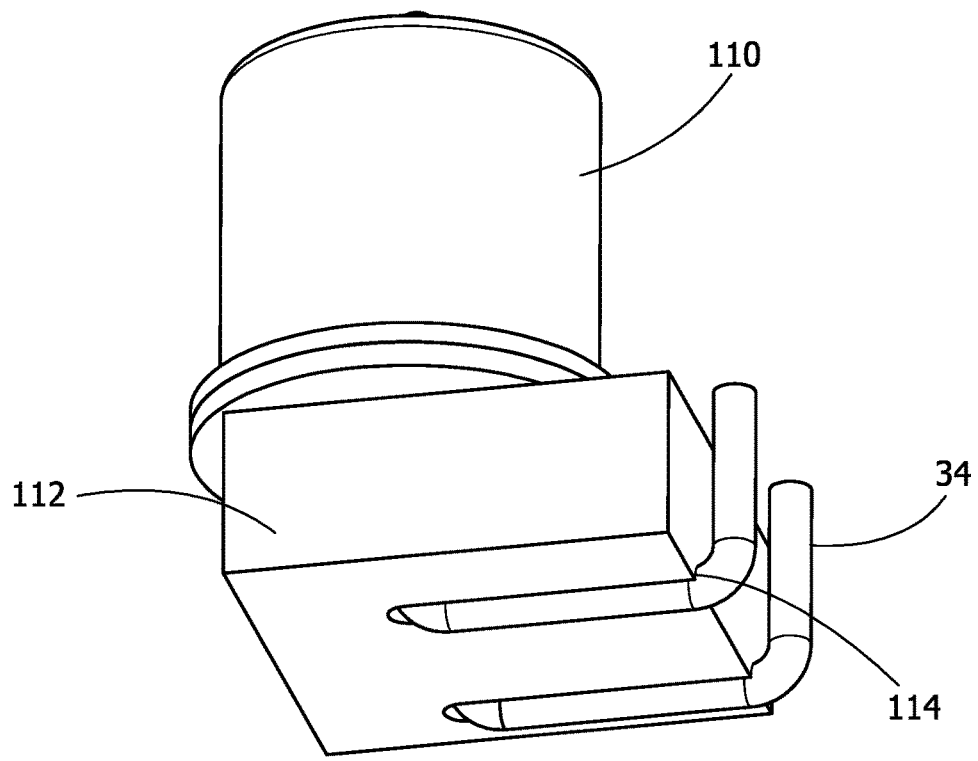
FIG. 5 is a view of an SMT housing assembly oriented at 90° to the SMT housing of FIGS. 2 and 3.

FIG. 5 is a view of an SMT housing assembly oriented at 90° relative to the SMT housing of FIGS. 2 and 3. The electronics component is assembled into the miniature housing such that the housing and the component are assembled vertically. The housing includes a shell 110 and a platform 112, the shell 110 extending in a vertical direction and formed or assembled onto the rectangular-shaped platform. Leads 34 from the electronics component extend through platform 112 and further extend parallel in at least one recess 114 formed in the bottom of platform 112 to the edge of platform 112 where the leads may be bent, for example in the upward direction as shown in FIG. 5.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A non-conductive miniature SMT housing, comprising:
   a non-conductive shell having a first end and a second end;
   a cylindrical cavity having a preselected diameter located within the shell;
   an annular counterbore having a preselected diameter, the preselected diameter of the annular counterbore being larger than the preselected diameter of the cylindrical cavity, the annular counterbore located at the first end of the shell extending a preselected axial length and forming a shoulder at the first end;
   a flat region extending tangentially along the shell; and
   a plurality of feet, the feet positioned opposite the flat region, each of the feet extending parallel to a central axis of the shell, each of the feet including a semicircular cavity of predetermined radius.

2. The non-conductive miniature SMT housing of claim 1 wherein the housing further comprises a material having a maximum temperature of use of at least 375° F.

3. The non-conductive miniature SMT housing of claim 1 wherein the housing further comprises a material having a maximum temperature of use of between 375-420° F.

4. The non-conductive miniature SMT housing of claim 2 wherein the material is a nonconductive injection-moldable polymeric material.

5. The non-conductive miniature SMT housing of claim 4 comprising polyphenylsulfone.

6. The non-conductive miniature SMT housing of claim 4 comprising polyphenylene sulfide.

7. The non-conductive miniature SMT housing of claim 1 wherein the second end further comprises an aperture in fluid communication with the cylindrical cavity.

8. A non-conductive miniature SMT housing assembly, comprising:
   a non-conductive shell having a first end and a second end;
   a cylindrical cavity having a preselected diameter located within the shell;
   an annular counterbore having a preselected diameter, the preselected diameter of the annular counterbore being larger than the preselected diameter of the cylindrical cavity, the annular counterbore located at the first end of the shell extending a preselected axial length and forming a shoulder at the first end;
   a flat region extending tangentially along the shell;
   a plurality of feet, the feet positioned opposite the flat region, each of the feet extending parallel to a central axis of the shell, each of the feet including a semicircular cavity of predetermined radius;
   an electronics component having a plurality of axial leads, the component having a flange of circular cross section and a body;
   wherein the flange has a diameter no greater than the preselected diameter of the annular counterbore of the housing and the body has a diameter no greater than the preselected diameter of the cylindrical cavity of the housing; and wherein the each of the plurality of axial leads from the electronics component are arcuately bent into one of the plurality of feet.

9. The non-conductive miniature SMT housing of claim 8 wherein the second end further comprises an aperture in fluid communication with the cylindrical cavity.

* * * * *